UHF-VHF TUNER WITH U-SHAPED STRIP BALANCED TRANSMISSION LINE

Filed Aug. 28, 1967 2 Sheets-Sheet 1

INVENTOR
DAVID J. CARLSON
BY Eugene M. Whitacre
ATTORNEY

UHF-VHF TUNER WITH U-SHAPED STRIP BALANCED TRANSMISSION LINE

Filed Aug. 28, 1967 2 Sheets-Sheet 2

INVENTOR
DAVID J. CARLSON
BY Eugene M. Whitacre
ATTORNEY

United States Patent Office 3,551,819

Patented Dec. 29, 1970

3,551,819

UHF–VHF TUNER WITH U-SHAPED STRIP BALANCED TRANSMISSION LINE

David J. Carlson, Indianapolis, Ind., assignor to RCA Corporation, a corporation of Delaware Filed Aug. 28, 1967, Ser. No. 663,760
Int. Cl. H04
U.S. Cl. 325—461 1 Claim

ABSTRACT OF THE DISCLOSURE

A UHF–VHF television tuner having a double tuned input circuit operable on both bands includes two mutually coupled resonant circuits, respectively made up of balanced quarter wave-lengths shorted sections of transmission lines and having tuning capacitors across the open ends thereof. During UHF operation, a voltage null exists at the shorted end of the lines so that switch connections made at these points for placing inductors in parallel with the tuned lines for VHF operation do not affect UHF performance.

This invention relates in general to tunable circuits, and more particularly to multiband tuners operable over a wide range of frequency, such as for example, the ultra-high frequency (UHF) and the very-high (VHF) television frequency bands.

The Federal Communications Commission has allocated 82 channels for the transmission of television signals in three frequency bands. Two of the bands are in the VHF portion of the spectrum and respectively cover 54–88 mHz. and 174–216 mHz. The third band covers 470–890 mHz. in the UHF spectrum. In television receivers capable of receiving any one of the 82 channels, it has heretofore been the practice to provide separate UHF and VHF tuners. A tuning system including two such tuners is not only complicated and expensive in the sense that there are two separate chassis and mounting means therefor, but in addition, the problem of providing a simple and foolproof tuning control and indicating system is made difficult because of the electrical power and signal switching required and the fact that the two separate tuning shafts must be controlled.

Many UHF tuners employ shorted quarter wavelength resonant unbalanced transmission lines for tuning UHF frequencies. In a commonly used tuner of this type, one end of the line is connected to ground (shorted) and the other is terminated by a variable capacitor which is used to tune the line to the desired resonant frequency.

Many attempts to manufacture all band tuners using common elements have been made. One method has been to adapt the UHF configuration described above to VHF operation by unshorting the end of the quarter-wave transmission line and inserting inductors for VHF band operation between that end and ground. This has been done by providing a switch for this purpose. Such a tuner is described in U.S. Pat. No. 3,275,958 to Rehm et al. In this type of construction the switch undesirably becomes part of the UHF and VHF circuits. The operation of the tuner is affected by the form of and deterioration of the switch contacts, as well as any variations in the switch geometry between the switches employed. In addition to switch difficulties, the same capacitance which is used to tune the UHF band is also used to tune the VHF bands; this requires the use of relatively large inductors to tune the VHF frequencies.

Accordingly, it is an object of the present invention to provide an improved all-band television tuner which is free of the aforementioned drawbacks.

Another object of the present invention is to provide an improved all-band tuner wherein a greater capacitance is available to tune the VHF bands than is used to tune the UHF band and which tuner requires no additional switches or capacitors for this purpose.

Still another object of the present invention is to provide a VHF and UHF tuner in which there is a minimum duplication of parts, and in which the band switch elements have a minimal effect on the tuner performance.

An all channel television tuner embodying the invention uses resonant circuits which consist of a tuned quarter wavelength shorted section of balanced transmission line. The length is electrically varied by two capacitors, each respectively in series with one conductor of the balanced line, to tune the UHF frequencies. At VHF frequencies the balanced line appears as a conductor which places the respective series capacitors, at the ends thereof, in parallel with each other and a selected VHF inductor. Because the same capacitors which are used in series on the UHF band are in parallel on the VHF band, four times the capacitance is available for tuning the VHF frequencies as that which tunes the UHF frequencies.

The novel features which are considered characteristic of the invention are set forth with particularity in the appended claims. The invention, however, as well as additional objects and features thereof, will best be understood from the following description when read in conjunction with the accompanying drawings in which:

Figures 1, 2:
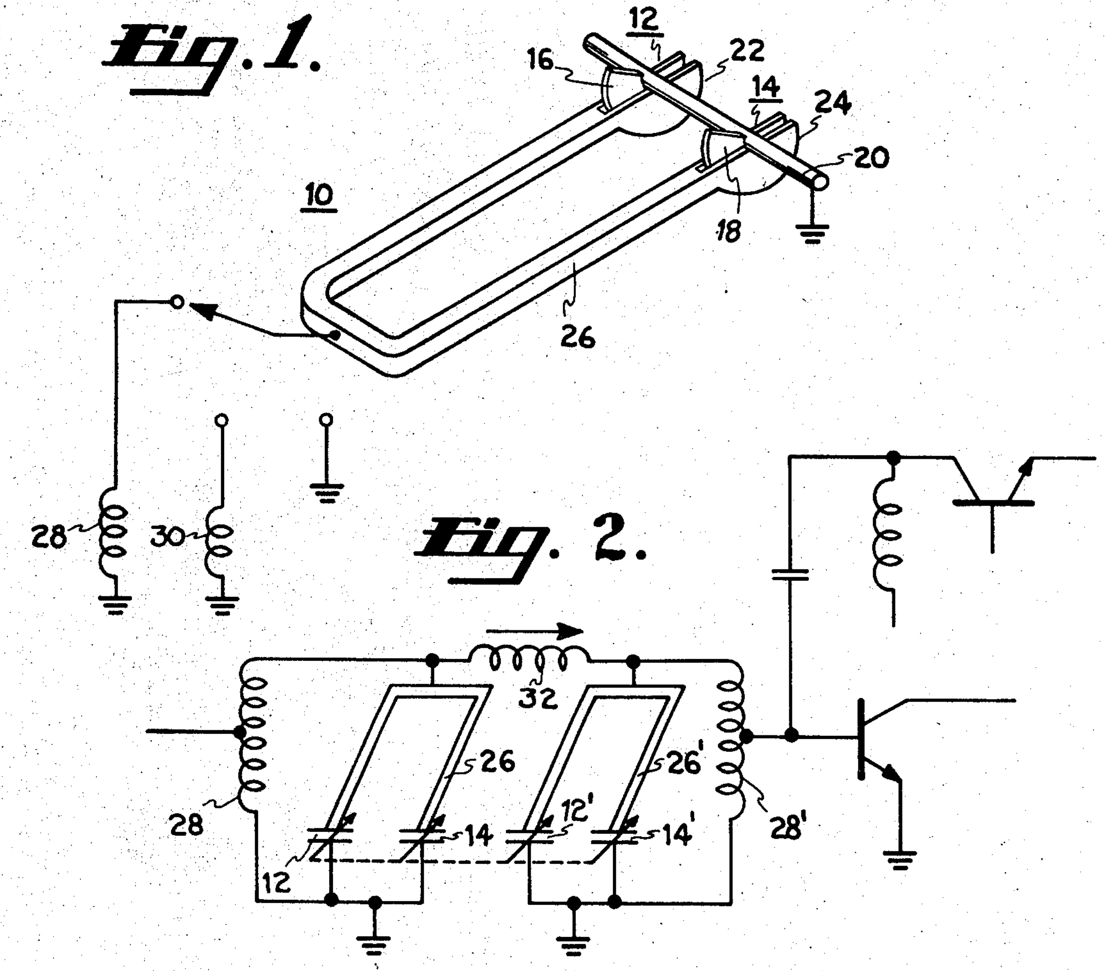
FIG. 1 is a diagram of a resonant circuit embodying the invention and capable of operation at both UHF and VHF frequencies.
FIG. 2 is a schematic circuit diagram of a portion of the tuner circuitry as used for VHF operation.

The tuned circuit 10 shown in FIG. 1 comprises two capacitors 12 and 14 of equal value having respective rotor plates 16 and 18 mounted on a common rotor shaft 20, which is connected to a reference potential indicated as ground. The capacitors 12 and 14 have stator plates 22 and 24 which are disposed at the respective ends of a U-shaped conductive strip 26. These stator plates may be integral with the U-shaped strip as shown. Depending upon the frequency band selected by the operator, either an inductor 28, inductor 30, or ground is selected, for use with the first or second VHF band or the UHF band respectively. Connection to ground for UHF operation is not necessary, but is shown here to illustrate that such is permissible due to the balanced nature of the circuit. Operation of this tuned circuit at the three bands in question will be described next in connection with FIGS. 2 and 3.

The tuner circuit utilized for operation on the lower VHF band is shown in FIG. 2. Two of the tuned circuits as described above and shown in FIG. 1 are used with a mutual coupling inductor 32 to form a double tuned input circuit. Elements of the second tuned circuit corresponding to those of FIG. 1 are indicated by a prime ('). Since the U-shaped strip is an ordinary conductor at VHF frequencies, the capacitors 12 and 14 of FIG. 1 are effectively in parallel and equivalent to one capacitor whose value is equal to the sum of capacitor 12 and capacitor 14. This double tuned circuit is essentially the same at the upper VHF band with the exception that the inductors 28 and 28' are replaced by others, not shown in FIG. 2, but having a lower value, and in the all channel tuner to be described later, the method of coupling the VHF signal between the tuned circuits is also different.

Figure 3:
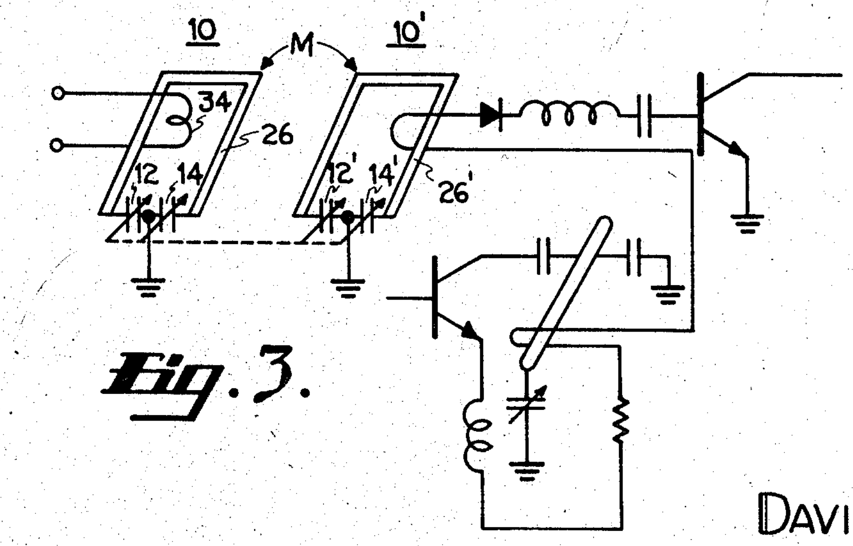
FIG. 3 is a schematic diagram of a portion of the tuner circuitry as used for UHF operation.

FIG. 3 shows a double tuned circuit using two of the circuits illustrated in FIG. 1 as incorporated in the all channel tuner. At UHF frequencies the parallel legs of the U-shaped strip form a parallel wire balanced transmission line with capacitors 12 and 14 in series across the open end. The opposite end is shorted by the bottom portion of the U. The line is resonant at the highest UHF frequency, with capacitors 12 and 14 tuned for minimum capacitance. As capacitors 12 and 14 operate in series at the open end of the transmission line, they have an effective capacitance equal to one-half of their individual values. The signal is both capacitively and inductively coupled from the first tuned circuit 10 to the second tuned circuit 10', as indicated in the figure by M. Inductor 34 couples the UHF signal from the UHF antenna into the tuned circuit 10.

The operation of the complete all channel tuner, illustrated in FIG. 4, employing two of the aforementioned resonant circuits, (indicated as 10 and 10') will now be described with respect to operation at the UHF band. In the figure, a low channel VHF ($V_1$), high channel VHF ($V_2$) and UHF band switch control is indicated generally by the reference numeral 8 and is shown with its movable switch portions 9, 11, 13, 15, and 17 in their respective UHF positions.

Loop 34 couples a received UHF signal from a pair of UHF antenna terminals 36 into the first of a pair of tuned circuits 10 and 10'. The values of mechanically coupled capacitors 12, 14, 12', and 14' determine the resonant frequency of the respective tuned circuits 10 and 10'. At UHF frequencies, the tuned circuits function as shorted one-quarter wavelength transmission lines. Circuit shielding, depicted in the figure by parallel lines (38) is physically provided by the tuner chassis walls. An opening 40 in this shielding surrounding these circuits couples the signal to the second tuned circuit 10'. A wire loop 42 is connected as shown through the window 40 in the chassis wall to form a current loop so that said coupling may be adjusted at UHF. The tuned circuits are thereby both capacitively and inductively coupled. Next, the signal is coupled to a mixing diode 44 by lead 46 which extends into the compartment occupied by the tuned circuit 10'. A UHF oscillator signal, generated by a circuit 54 including transistor 48 is also coupled to the diode 44 by lead 46. Capacitor 50 and strip 52 form the tuned portion of the UHF oscillator circuit 54, the operation of which is known in the art.

The heterodyne product, from the diode 44 is then coupled through an inductor 56, a portion 15 of the band switch 8 and a capacitor 58 to the base electrode of a transistor 60. Transistor 60 operates in the UHF mode as an IF amplifier. The amplifier signal is then coupled through an IF transformer 62 to the IF output terminal 64.

The operation of the all channel tuner for the lower VHF band will now be explained. For this set of frequencies the band switch 8 will be set to the $V_1$ position and physical switch portions 9, 11, 13, 15, and 17 in the drawing will be displaced one contact to the left from that shown in the figure. A signal appearing at the VHF antenna terminal 65 is coupled to one end of an inductor 66, the other end of which is connected to ground. The signal is then inductively coupled to an inductor 68. Inductor 68 is directly connected through an inductor 70, and the balanced transmission line 26 (which acts as a conductor at VHF frequencies), to the capacitors 12 and 14. As shown by the equivalent circuit in FIG. 2, capacitors 12 and 14 are in parallel with inductor 28 (corresponding to inductor 68 in FIG. 4).

The signal is then coupled from this first tuned circuit 10 to the second tuned circuit 10' through the inductor 72 and the coupling from the inductor 70 to the inductor 76. Thus the second tuned circuit essentially comprises the inductor 74 in parallel with the capacitors 12' and 14'. From the second tuned circuit 10' the signal is coupled by means of band switch portion 15 through capacitor 58 to the base of transistor 60, which is now arranged to function as a VHF mixer.

Following is a description of the operation of the tuner on the upper VHF band, for which the base switch 8 will be moved to its extreme lefthand position $V_2$. A signal received at the VHF antenna terminals 65 is now coupled by means of switch portion 11 to the junction of inductors 68 and 70, which together with parallel capacitors 12 and 14 form a first resonant circuit. This configuration is electrically similar to the tapped inductor 28, illustrated in FIG. 2. It will be noted that inductor 78 also effectively shunts inductor 68, thereby to eliminate any spurious resonance caused by this coil when the tuner is operated in the $V_2$ position. The signal is then inductively coupled, by means of inductors 70 and 76 from said first tuned circuit 10 to a second tuned circuit 10', which comprises the combination of inductors 74 and 80 both in parallel with capacitors 12' and 14'. The signal is then coupled from the second tuned circuit through capacitor 58 to the base of the mixer transistor 60 by switch portion 13, lead 82 and switch portion 15.

The VHF oscillator and mixer operation, which is similar for both VHF bands, will now be described. A separate VHF transistor oscillator 84, tuned by a capacitor 86, is employed so that proper frequency tracking on the VHF frequencies may be attained. This is necessary since the double-tuned input circuit capacitors 12, 14, 12', and 14' must be adjusted to achieve proper UHF tracking and thus could not be readjusted for VHF; further, any adjustments to the UHF oscillator might reduce its stability. Depending upon which VHF band ($V_1$ or $V_2$) is selected, either inductor 88 or inductor 90 in series with inductor 88, is placed in the collector circuit of the oscillator transistor 92 via band switch portion 17 and in parallel with capacitor 86. The VHF oscillator signal is then coupled to the base of mixer transistor 60 by means of the selector switch stray capacitance 94, shown in broken line form, between switch portions 15 and 17. If this capacitance (94) is insufficient, a small coupling capacitor, not shown, may be used between the base of transistor 60 and the collector of transistor 92.

Transistor 60 operates as a mixer when either of the VHF bands are tuned. This double use of transistor 60 as a UHF IF amplifier and a VHF mixer is preferred, rather than the alternative of providing a VHF mixing diode, and using transistor 60 only as a mixer. A mixing diode used for VHF would couple too much oscillator signal, which must be present to achieve proper injection, to the base of transistor 60 and prevent proper functioning of the latter as an IF amplifier. By using the present scheme, the need for a VHF oscillator frequency rejection filter at the base of transistor 60 is eliminated. Capacitor 96 in the collector circuit of transistor 60 is used to provide a voltage having the proper out of phase relationship for application to the base of transistor 60 through neutralizing capacitor 98.

Figure 4:
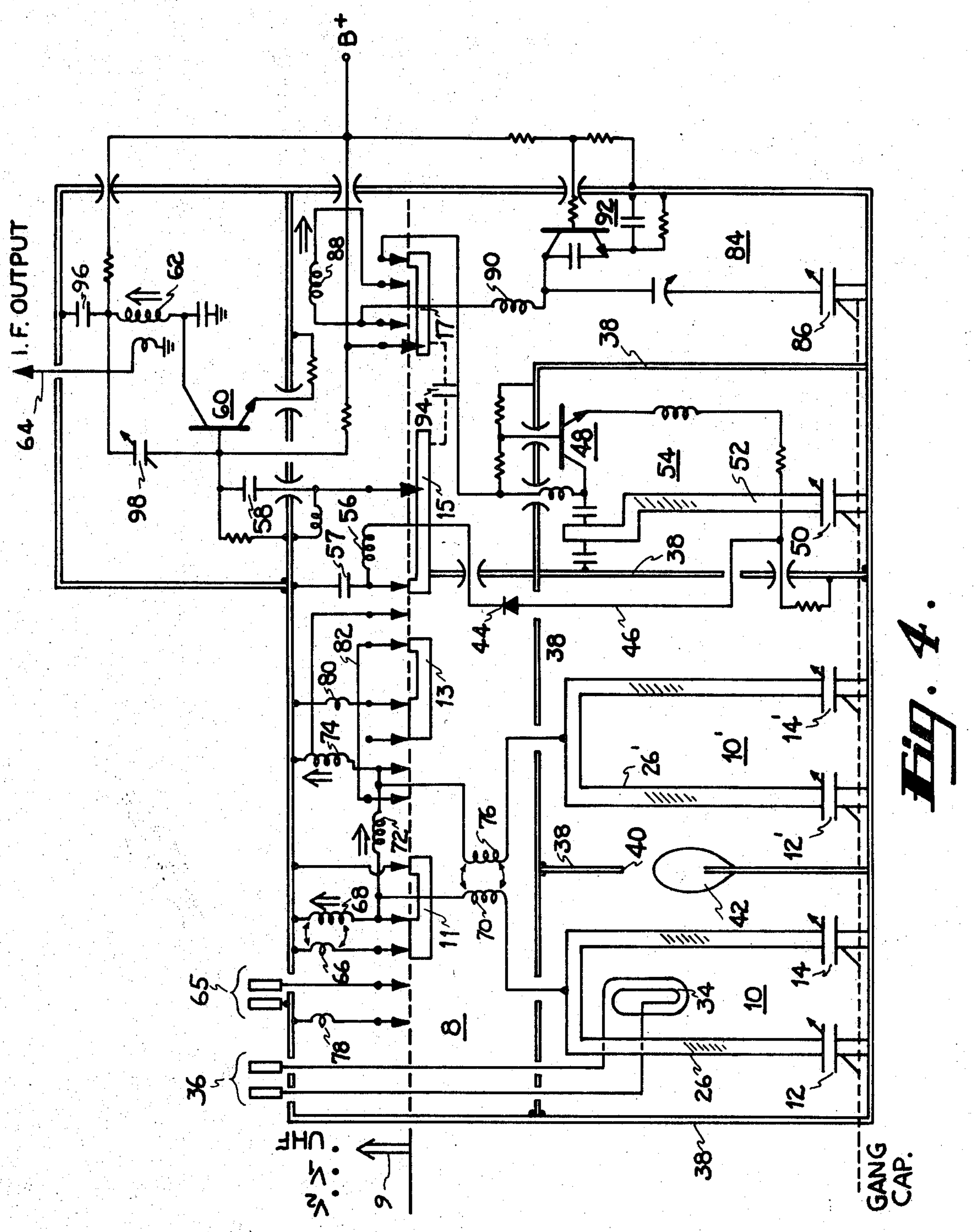
FIG. 4 is a combined schematic and pictorial representation of an all channel tuner embodying the invention.

Physically, one embodiment of the all channel tuner occupies a housing which is compartmentalized, as shown in FIG. 4, to provide necessary isolation and coupling. Exclusive of projecting shafts, the tuner occupies a total volume of 28 cubic inches. This approximately halves the volume required by standard VHF and UHF tuners widely in use at the present time. The components used are conventional as to type and values, and are therefore not listed. If desired, an RF amplifier stage may be included if cost considerations would permit the inclusion of an extra single or double tuned input circuit.

What is claimed is:

1. A tuner for operation across a band of UHF frequencies, a first band of VHF frequencies and a second band of VHF frequencies, comprising:

a housing;

a first and a second U-shaped strip each mounted within said housing and arranged such that the parallel legs of each strip form a balanced transmission line, and the bottom part of each U-shaped strip forms a shorting bar at one end of each transmission line, said first and said second balanced transmission line each resonant in a quarter wavelength mode during UHF operation of said tuner;

a first and a second variable capacitor means connected in series across the open end of said first U-shaped strip, the junction of said first and said second capacitor means connected to a point of fixed reference potential;

a third and a fourth variable capacitor means connected in series across the open end of said second U-shaped strip, the junction of said third and said fourth capacitor means connected to said point of fixed reference potential;

means mechanically ganging said first, said second, said third and said fourth variable capacitor means for unicontrol;

a conductive shield having an opening therein, said shield disposed within said housing between said first and said second balanced transmission lines;

a wire coupling loop positioned adjacent said first and said second transmission line and passed through the opening in said conductive shield, said loop providing an adjustable coupling means between said balanced transmission lines;

a first means and a second means each including a plurality of inductors;

a first three position switch interconnecting said first means and said first balanced transmission line;

a second three position switch interconnecting said second means and said second balanced transmission line; and said first and said second three position switch ganged together such that when said switch is in a first of said three positions, said tuner is tunable across said UHF band of frequencies, in a second of said three positions, said tuner is tunable across said first band of VHF frequencies, and in a third of said three positions, said tuner is tunable across said second band of VHF frequencies.

References Cited

UNITED STATES PATENTS

| | | | |
|---|---|---|---|
| 3,252,095 | 5/1966 | Carlson | 325—459 |
| 2,873,360 | 2/1959 | Lyman | 325—461 |
| 3,376,508 | 4/1968 | Jones | 325—459 |

ROBERT L. GRIFFIN, Primary Examiner

A. J. MAYER, Assistant Examiner

U.S. Cl. X.R.

325—459